United States Patent
Joshi et al.

(10) Patent No.: US 9,548,136 B2
(45) Date of Patent: Jan. 17, 2017

(54) METHOD TO IDENTIFY EXTRINSIC SRAM BITS FOR FAILURE ANALYSIS BASED ON FAIL COUNT VOLTAGE RESPONSE

(71) Applicant: GLOBALFOUNDRIES Inc., Grand Cayman (KY)

(72) Inventors: Vivek Joshi, San Jose, CA (US); Sriram Balasubramanian, Fremont, CA (US); Chad Weintraub, Austin, TX (US); Yoann Mamy Randriamihaja, Cohoes, NY (US); William McMahon, Scarsdale, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 87 days.

(21) Appl. No.: 14/664,959

(22) Filed: Mar. 23, 2015

(65) Prior Publication Data

US 2016/0284421 A1    Sep. 29, 2016

(51) Int. Cl.
*G11C 29/00* (2006.01)
*G11C 29/04* (2006.01)
*G11C 11/419* (2006.01)

(52) U.S. Cl.
CPC ............. *G11C 29/04* (2013.01); *G11C 11/419* (2013.01)

(58) Field of Classification Search
CPC .................................. G11C 29/04; G11C 11/419
See application file for complete search history.

(56) References Cited

U.S. PATENT DOCUMENTS

| 2007/0070683 A1* | 3/2007 | Fuhrmann | G11C 5/147 365/149 |
| 2014/0006847 A1* | 1/2014 | Guo | G06F 11/073 714/6.1 |
| 2014/0143630 A1* | 5/2014 | Mu | G06F 11/1048 714/763 |

OTHER PUBLICATIONS

Authors: Y. Mamy Randriamihaja, W. McMahon, S. Balasubramanian, T. Nigam, B. Parameshwaran, R. Mann, T. Klick, T. Schaefer, A. Kumar, Y. Song, V. Joshi, R. Ranjanp; Title: Assessing Intrinsic and Extrinsic End-of-Life Risk Using Functional SRAM Wafer Level Testing; Publisher: IEEE 978-1-4673-7362-3/15; Date: Apr. 2015.*

Randriamihaja et al., "Assessing Intrinsic and Extrinsic End-Of-Life Risk Using Functional SRAM Wafer Level Testing", 2 pages, Publication date is 2005, 978-1-4673-7362 IEEE.

* cited by examiner

*Primary Examiner* — April Y Blair
*Assistant Examiner* — Thien D Nguyen
(74) *Attorney, Agent, or Firm* — Ditthavong & Steiner, P.C.

(57) ABSTRACT

A method and an apparatus for identifying non-intrinsic defect bits from a population of failing bits for failure analysis to characterize the extrinsic failure mechanisms is provided. Embodiments include performing a failure mode test on a bank of a memory array at different low VDD; determining optimal bank size to observe plateaus of fail counts; determining fail counts of the bank at each different low VDD; determining a plateau of the fail counts; determining whether the plateau represents extrinsic bits of the bank; and submitting the extrinsic bits for root cause analysis.

13 Claims, 2 Drawing Sheets

METHOD TO IDENTIFY EXTRINSIC SRAM BITS FOR FAILURE ANALYSIS BASED ON FAIL COUNT VOLTAGE RESPONSE

TECHNICAL FIELD

The present disclosure relates to testing of static random-access memory (SRAM) arrays. The present disclosure is particularly applicable to the 28 nanometer (nm) technology node and beyond.

BACKGROUND

SRAM yield is limited by intrinsic (mismatch, targeting, etc.) and extrinsic (defect) mechanisms. To achieve a desired yield percentage with respect to a SRAM array, it is important to maintain defect Pareto to quantify extrinsic yield impact and address top extrinsic yield limiters. Both intrinsic and extrinsic defects may be found during the SRAM development phase; however, because only the intrinsic defects can be optimized, it is important to identify the extrinsic defects, e.g., a short, as early as possible to determine what part of the process is causing the defect.

Traditionally, extrinsic defects could be identified at high voltage, e.g., Vmax or higher, and then the corresponding bit could be submitted for further failure analysis (FA) to define the high voltage defect Pareto that needs to be addressed to improve yield. In contrast, only intrinsic mechanisms could be detected at low voltage, e.g., less than Vmax or from Vnom to Vmin. However, in the advanced technology nodes, a new category of fails is observed, known as the Low Voltage Extrinsics. This is a class of defects that can only be detected at voltages lower than Vmax, but disappear at high Vdds. As a result, these defects cannot be detected using a simple Vmax based test and FA. Since these defect mechanisms limit the low voltage yield, it is critical to identify and improve them early in the development phase since they cannot be addressed by intrinsic improvement alone. With large numbers of bits failing at low VDD within a region of an array and generally limited FA resources, it is difficult to efficiently select the right defect driven failing bits for FA. Normally, a few bits that failed at higher voltages than Vmin are randomly selected for FA analysis. However, just because the bit failed at higher voltages does not mean that the failure was extrinsic in nature. Moreover, a large number of such submissions result in No Defect Found (NDF), since the bits submitted for FA are intrinsic and not defect driven. This, in turn, limits the ability to efficiently characterize low voltage defects.

A need therefore exists for a methodology and apparatus enabling a simple identification of non-intrinsic defect bits from a population of low voltage failing bits for FA to characterize the extrinsic failure mechanisms.

SUMMARY

An aspect of the present disclosure is a method of identifying non-intrinsic defect bits from a population of failing bits for FA to characterize the extrinsic failure mechanisms.

Another aspect of the present disclosure is an apparatus that identifies non-intrinsic defect bits from a population of failing bits for FA.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: performing a failure mode test on a bank of a memory array at different low VDD; determining optimal bank size to observe plateaus of fail counts; determining fail counts for the bank at each different low VDD; determining a plateau of the fail counts; determining whether the plateau represents extrinsic bits of the bank; and submitting the extrinsic bits for root cause analysis.

Aspects of the present disclosure include performing the failure mode test at different low VDD by: incrementally decreasing the VDD. Other aspects include performing the failure mode test by: testing the bank in a retention mode prior to testing the bank in a read or a write mode. Further aspects include testing the bank in each of the read and write modes when the retention mode test fails to produce the plateau representing extrinsic bits. Additional aspects include determining whether the plateau represents extrinsic bits based on a size of the memory array, a size of the plateau, and the failure mode test. Another aspect includes determining whether the plateau represents extrinsic bits based on VDD step size and access disturb margin (ADM)/write margin (WRM) slope versus VDD for a bitcell of interest. Other aspects include determining that the bank has no extrinsic bits when the fail counts increase as the VDD is lowered. Further aspects include the memory array being a SRAM array.

Another aspect of the present disclosure is an apparatus including: a processor; and a memory including computer program code for one or more programs, the memory and the computer program code configured to, with the processor, cause the apparatus to perform the following, perform a failure mode test on a bank of a memory array at different low VDD; determine optimal bank size to observe plateaus of fail counts; determine fail counts for the bank at each different low VDD; determine a plateau of the fail counts; determine whether the plateau represents extrinsic bits of the bank; and submit the extrinsic bits for root cause analysis.

Aspects of the apparatus include the apparatus being further caused, with respect to performing the failure mode test, to: incrementally decrease the VDD. Other aspects include the apparatus being further caused, with respect to performing the failure mode test, to: test the bank in retention mode prior to testing the bank in a read or a write mode. Further aspects include the apparatus being further caused to: test the bank in each of the read and write modes when the retention mode test fails to produce the plateau representing extrinsic bits. Additional aspects include the apparatus being further caused to: determine whether the plateau represents an extrinsic failure based on a size of the memory array, a size of the plateau, and the failure mode test. Another aspect includes the apparatus being further caused to: determine whether the plateau represents extrinsic bits based on VDD step size and ADM/WRM slope versus VDD for a bitcell of interest. Other aspects include the apparatus being further caused to: determine that the bank has no extrinsic bits when the fail counts increase as the VDD is lowered.

A further aspect of the present disclosure is a method including: performing a retention failure mode test on a bank of a SRAM array at different low VDD; determining optimal bank size to observe plateaus of fail counts; determining fail counts of the bank at incrementally decreasing low VDD; determining a plateau of the fail counts; determining whether the plateau represents extrinsic bits of the bank; and submitting the extrinsic bits for root cause analysis.

Aspects of the present disclosure include testing the bank in each of a read mode test and a write mode test when the retention failure mode test fails to produce the plateau representing extrinsic bits. Other aspects include determining whether the plateau represents extrinsic bits based on a size of the SRAM array, a size of the plateau, and the failure mode test. Further aspects include determining whether the plateau represents extrinsic bits based on VDD step size and ADM/WRM slope versus VDD for a bitcell of interest. Additional aspects include determining that the bank has no extrinsic bits when the fail counts increase as the VDD is lowered.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of identifying extrinsic SRAM bits from a population of failing bits attendant upon developing a SRAM array.

Methodology in accordance with embodiments of the present disclosure includes performing a failure mode test on a bank of a memory array at different low VDD. An optimal bank size for observing plateaus of fail counts is determined. Fail counts for the bank are determined at each different low VDD. A plateau of the fail counts is determined. The plateau is examined to determine whether it represents extrinsic bits of the bank. The extrinsic bits are submitted for root cause analysis.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
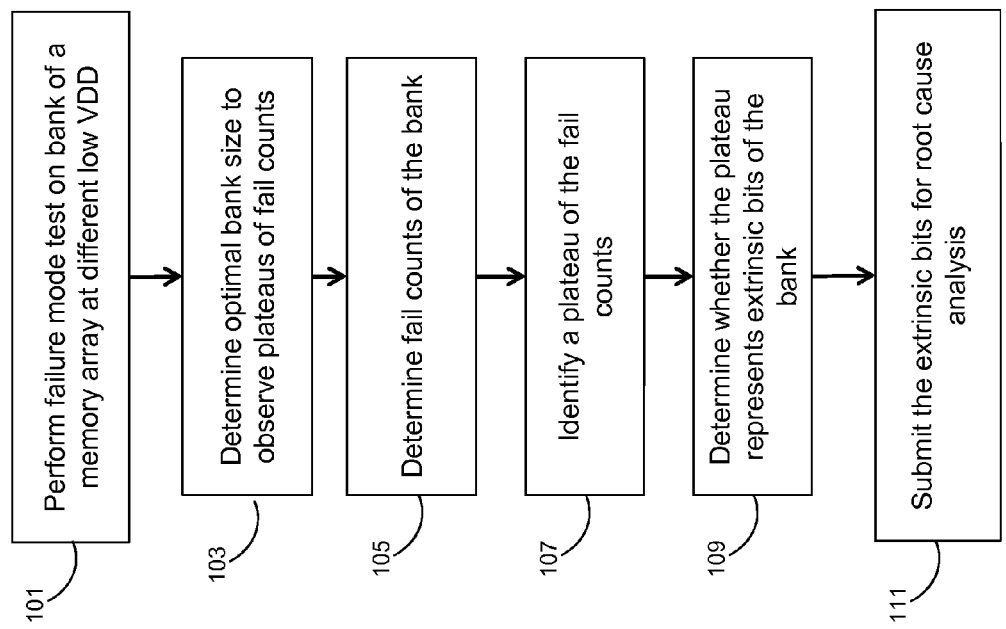
FIG. 1 illustrates a low VDD extrinsic SRAM bit identification flow, in accordance with an exemplary embodiment.

Adverting to FIG. 1, in step 101, a failure mode test is performed on a bank of a memory array, e.g., a SRAM array, at different low VDD. The applicable failure modes are read, write, and retention. However, the bank is first tested in the retention mode because if the bank fails in the retention mode, it will also fail in the read or write mode. The failure mode test, e.g., the retention mode failure test, is performed at different low VDD by incrementally decreasing the VDD, e.g. at 10% increments.

In step 103, an optimal bank size for observing plateaus of fail counts is determined. This determination increases the overall effectiveness of identifying non-intrinsic defect bits from a population of low voltage failing bits for FA and reduces NDF cases. In step 105, fail counts for the bank are determined at each different low VDD. In particular, intrinsic (parametric) fail counts increase exponentially at lower VDD, whereas extrinsic defect mechanisms result in a plateau in fail count versus VDD testing. In step 107, the fail counts determined in step 105 are examined to determine whether any form a "plateau" as the term is commonly understood. Next, in step 109, any plateaus identified in step 107 are further examined to determine whether the plateau represents an extrinsic bit failure. This determination may be based, for example, on the size of the memory array being tested and the type of failure mode test, e.g., retention, read, or write, being performed. In addition, the length of a plateau representing an extrinsic bit failure depends on the VDD step size and the access disturb margin/write margin (ADM/WRM) slope versus VDD for the bitcell of interest. In the case where the retention mode test fails to produce a plateau representing an extrinsic failure, the bank is next tested in each of the read and write modes (in no particular order). In step 111, the bits corresponding to an extrinsic failure plateau are submitted for root cause analysis to determine what part of the SRAM development process is causing the problem, e.g., a short. In contrast, banks with no extrinsic defects will show a fail count versus VDD that increases as VDD is lowered similar to the intrinsic fail count of the particular bank.

Figure 2:
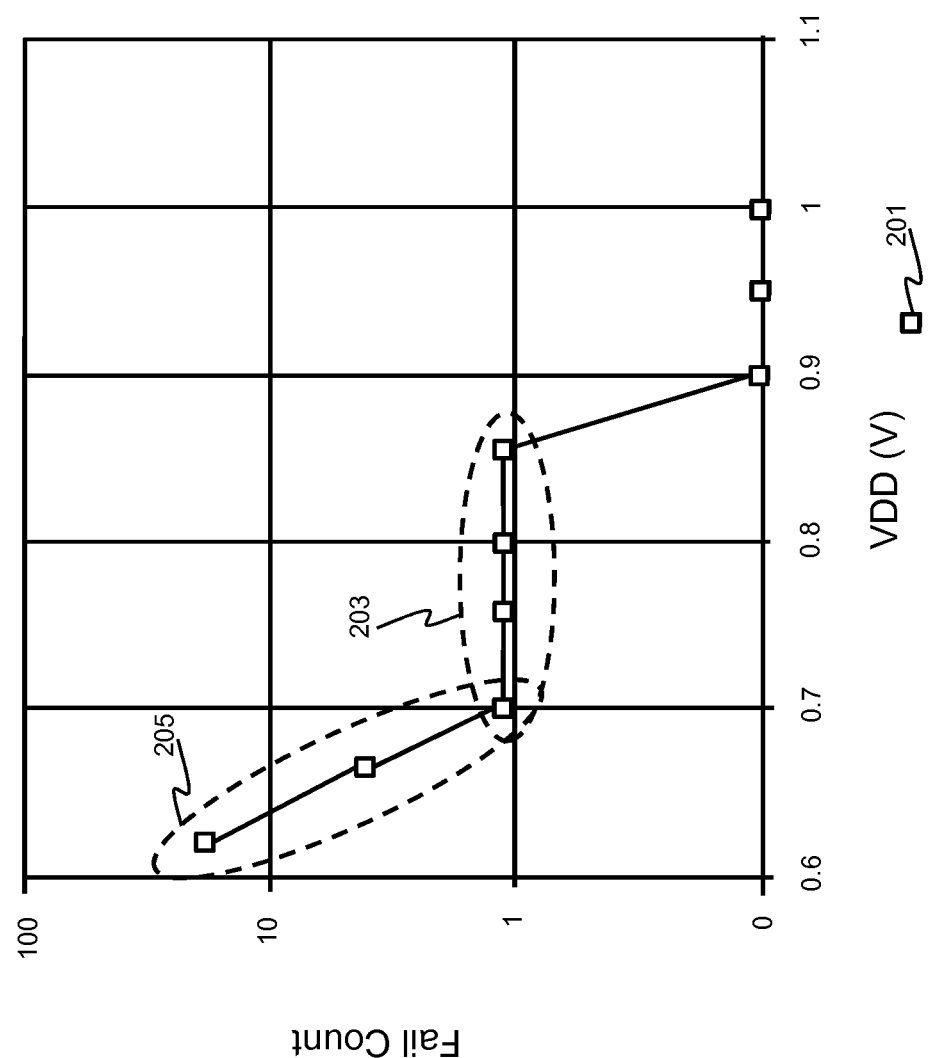
FIG. 2 illustrates an example extrinsic SRAM bit identification based on a retention failure mode test at incrementally lower VDD, in accordance with an exemplary embodiment.

Adverting to FIG. 2, a retention failure mode test is performed on an example SRAM array at incrementally lower VDD, e.g., decreasing by 10%. The voltage responses of fail counts 201 are plotted on a graph at each of the different low VDD (the y-axis of the graph representing fail count and the x-axis representing VDD). As previously discussed above, intrinsic fail counts increase exponentially at lower VDD, whereas extrinsic mechanisms result in a plateau in fail count versus VDD testing. The fail counts 201 are then examined to determine if any plateaus are present. In this example, the fail counts 201 within the dashed circle 203 form such a plateau. In contrast, the fail counts 201 formed within the dashed circle 205 represent an exponential increase and, therefore, are consistent with an intrinsic failure. Next, whether the plateau of fail counts 201 within the dashed circle 203 represents an extrinsic bit failure is determined based on the memory size being tested and the failure mode test being performed. If it is determined that the plateau represents an extrinsic bit failure, the corresponding bits are submitted for root cause analysis to determine what part of the development process is causing the problem, e.g., a short.

The embodiments of the present disclosure can achieve several technical effects including simply identifying non-intrinsic defect bits from a population of failing bits for failure analysis. The present disclosure can also significantly reduce the number of NDF cases found. Further, the present disclosure is applicable to all low voltage fail modes, e.g., read, write, and retention. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices including SRAM cells in the 28 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
performing a failure mode test on a bank of a memory array at different low positive supply voltage (VDD) by incrementally decreasing the VDD and testing the bank in a retention mode prior to testing the bank in a read or a write mode;
determining optimal bank size to observe plateaus of fail counts;
determining fail counts for the bank at each different low VDD;
determining a plateau corresponding of the fail counts;
determining whether the plateau represents extrinsic bits of the bank; and
submitting the extrinsic bits for root cause analysis,
wherein the bank is tested in each of the read and write modes when the retention mode test fails to produce the plateau representing extrinsic bits.

2. The method according to claim 1, comprising determining whether the plateau represents extrinsic bits based on a size of the memory array, a size of the plateau, and the failure mode test.

3. The method according to claim 2, comprising determining whether the plateau represents extrinsic bits based on VDD step size and access disturb margin (ADM)/write margin (WRM) slope versus VDD for a bitcell of interest.

4. The method according to claim 1, further comprising determining that the bank has no extrinsic bits when fail counts increase as the VDD is lowered.

5. The method according to claim 1, wherein the memory array is a static random-access memory (SRAM) array.

6. An apparatus comprising:
a processor; and
a memory including computer program code for one or more programs, the memory and the computer program code configured to, with the processor, cause the apparatus to perform the following,
perform a failure mode test on a bank of a memory array at different low positive supply voltage (VDD) by testing the bank in retention mode prior to testing the bank in a read or write mode;
determine optimal bank size to observe plateaus of fail counts;
determine fail counts for the bank at each different low VDD;
determine a plateau corresponding of the fail counts;
determine whether the plateau represents extrinsic bits of the bank; and
submit the extrinsic bits for root cause analysis,
wherein the bank is tested in each of the read and write modes when the retention mode test fails to produce the plateau representing extrinsic bits.

7. The apparatus according to claim 6, wherein the apparatus is further caused, with respect to performing the failure mode test, to:
incrementally decrease the VDD.

8. The apparatus according to claim 6, wherein the apparatus is further caused to:
determine whether the plateau represents an extrinsic failure based on a size of the memory array, a size of the plateau, and the failure mode test.

9. The apparatus according to claim 8, wherein the apparatus is further caused to:
determine whether the plateau represents extrinsic bits based on VDD step size and access disturb margin (ADM)/write margin (WRM) slope versus VDD for a bitcell of interest.

10. The apparatus according to claim 6, wherein the apparatus is further caused to:
determine that the bank has no extrinsic bits when the counts increase as the VDD is lowered.

11. A method comprising:
performing a retention failure mode test on a bank of a static random-access memory (SRAM) array at different low positive supply voltage (VDD);
determining optimal bank size to observe plateaus of fail counts;
determining fail counts of the bank at incrementally decreasing low VDD;
determining a plateau of the fail counts;
determining whether the plateau represents extrinsic bits of the bank based on a size of the SRAM array, a size of the plateau, and the failure mode test; and
submitting the extrinsic bits for root cause analysis,
wherein determining whether the plateau represents extrinsic bits is further based on VDD step size and access disturb margin (ADM)/write margin (WRM) slope versus VDD for a bitcell of interest.

12. The method according to claim 11, further comprising testing the bank in each of a read mode test and a write mode test when the retention failure mode test fails to produce the plateau representing extrinsic bits.

13. The method according to claim 11, further comprising determining that the bank has no extrinsic bits when the fail counts increase as the VDD is lowered.

* * * * *